United States Patent
Yamamoto et al.

(10) Patent No.: US 6,783,628 B2
(45) Date of Patent: Aug. 31, 2004

(54) PLASMA PROCESSING APPARATUS

(75) Inventors: Naoko Yamamoto, Osaka (JP);
Tatsushi Yamamoto, Ikoma-gun (JP);
Masaki Hirayama, Sendai (JP);
Tadahiro Ohmi, Sendai (JP)

(73) Assignees: Sharp Kabushiki Kaisha, Osaka (JP);
Tadihiro Ohmi, Miyagi (JP)

(*) Notice: Subject to any disclaimer, the term of this patent is extended or adjusted under 35 U.S.C. 154(b) by 135 days.

(21) Appl. No.: 10/007,127

(22) Filed: Dec. 3, 2001

(65) Prior Publication Data
US 2002/0123200 A1 Sep. 5, 2002

(30) Foreign Application Priority Data
Dec. 4, 2000 (JP) ........................... 2000-368508

(51) Int. Cl.[7] ............................ H05H 1/00; C23C 16/00
(52) U.S. Cl. ........................ 156/345.41; 118/723 MW
(58) Field of Search ................... 156/345.41, 345.42, 156/345.36; 118/723 MW, 723 MR, 723 ME, 723 MA

(56) References Cited

U.S. PATENT DOCUMENTS

| 5,517,085 A | * | 5/1996 | Engemann et al. | ..... 315/111.21 |
| 5,545,258 A | * | 8/1996 | Katayama et al. | .... 118/723 MP |
| 5,614,025 A | * | 3/1997 | Akimoto | .............. 118/723 MP |
| 5,645,644 A | * | 7/1997 | Mabuchi et al. | .... 118/723 MW |
| 5,843,236 A | * | 12/1998 | Yoshiki et al. | ....... 118/723 MR |

FOREIGN PATENT DOCUMENTS

| JP | 4-117437 | 10/1992 |
| JP | 2000-68227 | 3/2000 |
| JP | 2000-91097 | 3/2000 |

* cited by examiner

Primary Examiner—Parviz Hassanzadeh
(74) Attorney, Agent, or Firm—Edwards & Angell, LLP; David G. Conlin; Lisa S. Hazzard

(57) ABSTRACT

A slot antenna plate is placed on a second dielectric for radiating microwave into a chamber interior, the slot antenna plate being provided on a side of the second dielectric that faces the chamber interior. The slot antenna plate is made of conductor and includes slots for passing the microwave there through to the chamber interior. In this way, a plasma processing apparatus is provided generating plasma by microwave, the plasma processing apparatus capable of easily adjusting ion irradiation energy for a material to be processed to achieve uniform plasma processing for the material within the plane of the material.

5 Claims, 9 Drawing Sheets

PLASMA PROCESSING APPARATUS

BACKGROUND OF THE INVENTION

1. Field of the Invention

The present invention relates to plasma processing apparatuses. In particular, the invention relates to a plasma processing apparatus such as etching, film deposition and ashing apparatuses used for the process of manufacturing a semiconductor device, liquid crystal display or solar cell for example.

2. Description of the Background Art

With increase in size of a substrate used for manufacturing a semiconductor device, LCD (liquid crystal display) or the like, plasma processing apparatuses have recently been developed for processing such a substrate with a large area. Apparatuses are developed particularly for LCD to process a substrate of 1 m×1 m or greater in size. These apparatuses address a challenge of making plasma uniform A challenge to be addressed by those apparatuses developed for film deposition, etching and ashing for example is improvement of the plasma processing rate for enhancement of the throughput of the apparatuses. A challenge for a dry etching apparatus is to control the cross sectional shape produced by etching in order to meet the increasingly reduced size of the pattern as well as the increased number of layers.

A microwave plasma processing apparatus with the purpose of ensuring uniform plasma is disclosed for example in Japanese Utility Model Laying-Open No. 4-117437 according to which a metal plate having slits is provided between an air layer under a microwave line of dielectric and a second dielectric to adjust the intensity distribution of microwave and accordingly achieve a uniform plasma density in a plasma generating chamber.

The plate for this apparatus is thick in consideration of deformation. However, the thick plate causes an abnormal discharge on the edge of the central portion of a microwave guide chamber. When a thinner plate is used, the metal and dielectric cannot be brought into contact with each other due to large thermal expansion coefficients of the metal and dielectric and an abnormal discharge could occur. These problems are indicated in Japanese Patent Laying-Open No. 2000-91097 which discloses its invention to overcome the problems.

FIG. 9 shows a structure employed by the invention disclosed in Japanese Patent Laying-Open No. 2000-91097, including a microwave dispersion plate 65 made of Al (aluminum) with a thickness in a range from 0.2 mm to 2 mm. Specifically, referring to FIG. 9, microwave is transmitted from a microwave generator 61 to be passed through a waveguide 62, a dielectric line 63, an air layer, a first dielectric 64, microwave dispersion plate 65, a second dielectric 66, and a third dielectric 67 to supply energy to a processing chamber 68. This structure provides a uniform ashing.

It is a known technique to apply, to a material to be processed, a bias voltage of DC, AC or pulse in order to control the amount of plasma ion irradiation and thus control the processing rate or the cross sectional shape of an etched film. A method of applying a bias voltage to a material to be processed is disclosed for example in Japanese Patent Laying-Open No. 2000-68227 according to which a porous electrode fixed at a ground or positive potential is provided to face a plane of the material to be processed with a space therebetween, so that a pulse or DC bias voltage is applied to the material.

Although Japanese Utility Model Laying-Open No. 4-117437 and Japanese Patent Laying-Open No. 2000-91097 show the technique of using a dispersion plate for rendering microwave uniform, no method of designing the dispersion plate is disclosed. In addition, although application of a high-frequency bias voltage to a sample stage is disclosed, the third dielectric 67 shown in FIG. 9 opposite a substrate 71 is made of ceramic so that the potential of the third dielectric 67 cannot be adjusted. Therefore, an efficient application of the bias voltage to substrate 71 is impossible and thus a problem arises that an adjustable range of ion irradiation energy to a material to be processed cannot be expanded According to a technique in an embodiment of Japanese Patent Laying-Open No. 2000-68227, an ICP (inductively coupled plasma) apparatus is used with a plasma source which is an RF (radio frequency) power source on the order of MHz in frequency, and thus nothing is described about generation of plasma by means of a microwave power source. Accordingly, no problem is described that arises due to the shorter wavelength of microwave than the length of a vacuum device with one side of approximately several hundreds mm to 1000 mm (for f=2.45 GHz, free-space wavelength in vacuum is 122 mm). In other words, there is disclosed no design to address the problem concerning the standing wave distribution of microwave when plasma is excited.

For a microwave-excited plasma processing apparatus, a microwave circuit should be regarded as a resonator and a portion where microwave enters a vacuum chamber constitutes a part of the resonator. Then a design should be made in consideration of propagation characteristics of the microwave regarding the microwave entrance portion, in terms of start and maintenance of plasma discharge by a low power as well as plasma uniformity. However, the publications referred to above provide no guideline for making such a design.

SUMMARY OF THE INVENTION

One object of the present invention is to provide a plasma processing apparatus using microwave to excite plasma, with easily-adjustable ion irradiation energy directed to a material to be processed as well as uniform plasma processing of the material within its plane.

According to the present invention, the plasma processing apparatus includes a process chamber for processing by means of plasma, a microwave transmission unit for transmitting microwave to the process chamber, a dielectric for radiating the microwave transmitted by the microwave transmission unit into the process chamber, and a slot antenna plate formed of conductor, placed on a side, facing the process chamber, of the dielectric, and including an opening for passing the microwave there through radiated from the dielectric.

The plasma processing apparatus of the present invention includes the slot antenna made of conductor, the slot antenna being placed on the side of the dielectric that faces the process chamber, and thus the potential of the slot antenna plate can readily be adjusted. Then, the potential of the slot antenna plate can be adjusted to control the direction of plasma ions for example with respect to a substrate being processed (bias effect). For example, plasma ions can be made incident on the entire surface of the substrate substantially perpendicularly thereto by adjusting the potential of the slot antenna plate at a ground potential and applying a bias voltage to the substrate. A material can thus be plasma-processed uniformly within its plane.

Moreover, the slot antenna plate can be made contact with the dielectric to shorten a space wavelength of microwave compared with that when an air layer is present between the slot antenna plate and dielectric. Consequently, the intervals between openings of the slot antenna plate can be shortened so that a greater number of openings are formed. The microwave radiated into the process chamber through the openings can thus be distributed uniformly in the process chamber.

In addition, a plurality of openings with their positions and dimensions appropriately defined for the standing wave of microwave can provide efficient and uniform radiation of the microwave into the process chamber.

Preferably, for the plasma processing apparatus described above, the opening of the slot antenna plate is positioned directly below an antinode of a standing wave of the microwave in a resonator constituted of the microwave transmission unit and the dielectric.

The magnetic field directly below the antinode of the standing wave is greater. Then, the opening is positioned directly below the antinode of the standing wave to allow current to be induced around the opening, this current inducing a magnetic field from the opening. In other words, an efficient radiation of the microwave into the process chamber is achieved by placing the opening directly below the antinode of the standing wave.

Preferably, for the above-described plasma processing apparatus, the slot antenna plate has its potential adjusted at a ground potential or a positive potential.

The potential adjustment of the slot antenna plate makes it possible to control the direction of plasma ions for example with respect to a substrate to be processed.

Preferably, for the above-described plasma processing apparatus, the slot antenna plate includes a channel for a process gas.

In this way, control of the process gas flow is facilitated so that a material to be processed can uniformly be processed with plasma.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in conjunction with the drawings.

First Embodiment

Figure 1:
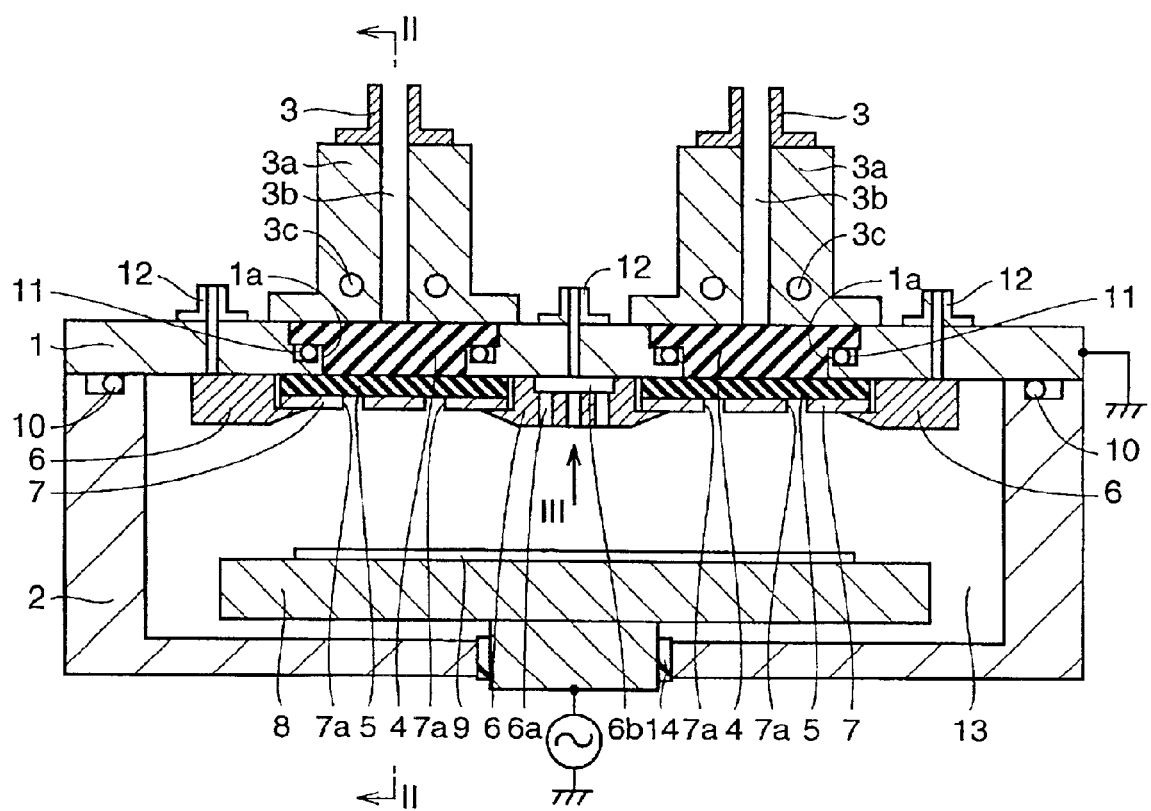
FIG. 1 is a schematic cross section showing a structure of a plasma processing apparatus according to a first embodiment of the present invention.
Figure 2:
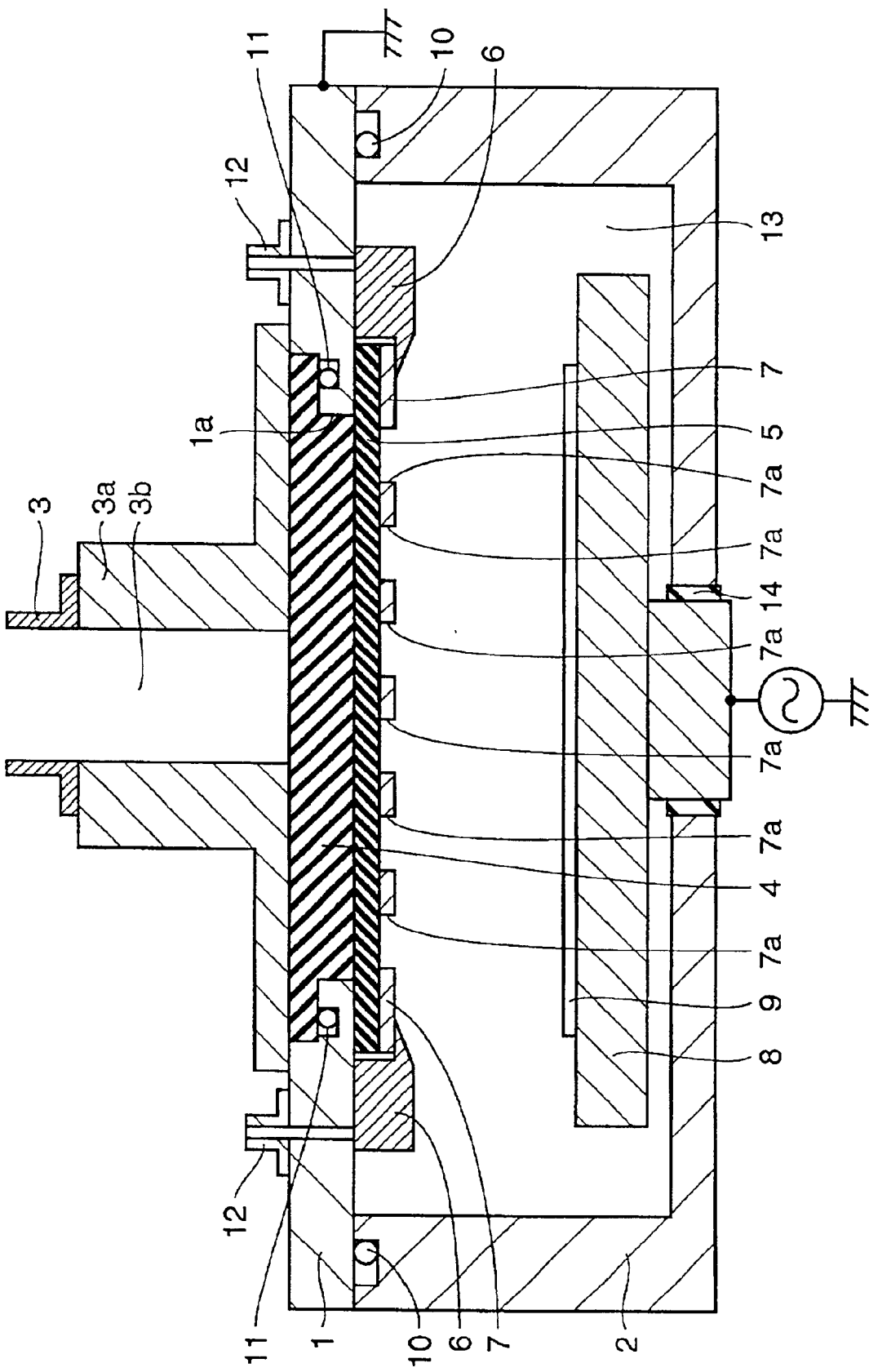
FIG. 2 is a schematic cross section along line II—II in FIG. 1.
Figure 3:
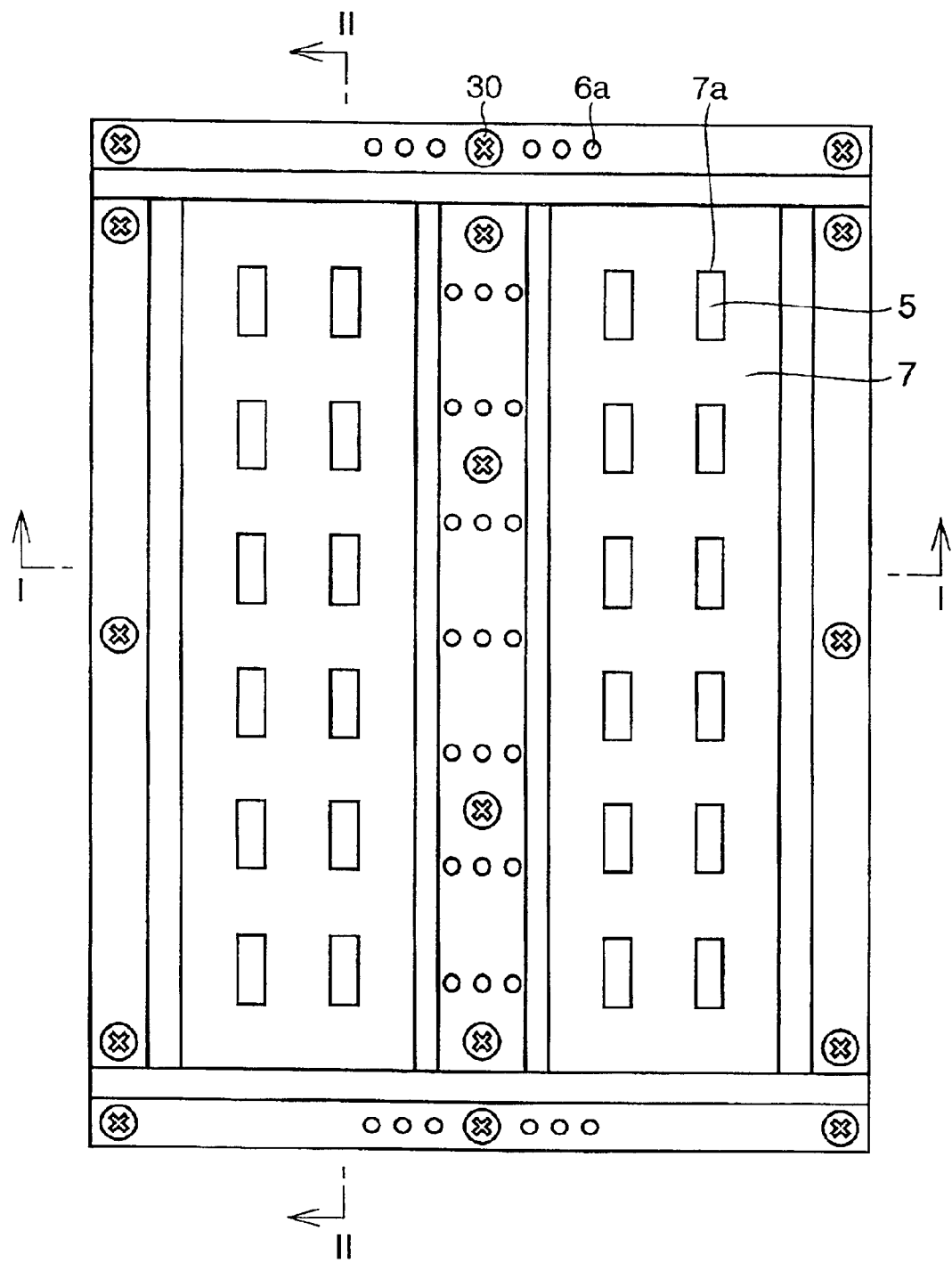
FIG. 3 shows an arrangement of a second dielectric, a slot antenna plate and a support member viewed in the direction of arrow m in FIG. 1.

Referring to FIGS. 1–3, a plasma processing apparatus according to a first embodiment includes as main components a chamber lid 1, a process chamber body 2, a waveguide 3, an entrance waveguide 3a, a first dielectric 4, a second dielectric 5, a support member 6, a slot antenna plate 7, and a substrate holder 8.

It is noted that respective cross sections shown in FIGS. 1 and 2 correspond to lines I—I and II—II in FIG. 3 respectively.

Chamber lid 1 is placed opposite process chamber body 2 and they are sealed with a gasket 10. Chamber lid 1 has a slit-shaped opening 1a in which the first dielectric 4 is inserted that is made of dielectric such as $SiO_2$, $Al_2O_3$ and AlN with a cross section in the shape like "T" with the boldfaced longitudinal line. Chamber lid 1 and the first dielectric 4 are also sealed with a gasket 11 which provides airtightness to the interior 13 of the chamber together with gasket 10. The air in chamber interior 13 is exhausted by a vacuum pump such as turbo-molecular pump (not shown) to maintain the interior 13 in a vacuum state of approximately $10^{-4}$ Pa to $10^{-3}$ Pa.

The first dielectric 4 has its side exposed to the atmosphere (hereinafter referred to "atmosphere side"), and entrance waveguide 3a is placed on the atmosphere side and fastened to chamber lid 1 with bolts. Waveguide 3 is fastened to the central part of the upper plane of entrance waveguide 3a. Microwave of 2.45 GHz in frequency generated from a magnetron is directed to waveguide 3 through an isolator and an automatic matching device for example and further through a microwave solid circuit with a direct waveguide, a corner waveguide, a tapered waveguide and a branch waveguide for example (not shown). The microwave is thereafter radiated from an opening 3b toward the first dielectric 4.

Entrance waveguide 3a has a heat-insulating channel 3c where a heat-insulating medium flows for keeping a predetermined temperature of entrance waveguide 3a and its peripheral portion. Chamber lid 1 and process chamber body 2 also have heaters and heat-insulating channels (not shown) providing a temperature-regulating function for keeping the chamber temperature uniform by heating of the heater and flow of a heat-insulating medium through the heat-insulating channel.

Chamber lid 1 has its side exposed to the vacuum (hereinafter referred to as vacuum side). On the vacuum side, a plurality of (e.g. four) second dielectrics 5 made of dielectric such as $Al_2O_3$, $SiO_2$ and AlN are arranged in contact with the first dielectric 4. Under the second dielectrics 5, slot antenna plate 7 made of conductor is fixed to contact the second dielectrics 5.

Support member 6 made of conductor is fastened around the second dielectrics 5 and slit antenna plate 7 with screws 30 for example as shown in FIG. 3 for supporting the second dielectrics 5 and slot antenna plate 7 on chamber lid 1. Slot antenna plate 7 has rectangular slots 7a as shown in FIG. 3 and has a thickness of 1 to 20 mm for example. Rectangular slots 7a are positioned in accordance with a design made for performing a function of a slot antenna described later.

Slot antenna plate 7 is made of Al or SUS for example. A spring material may be inserted between slot antenna plate 7 and support member 6 for ensuring closer contact between slot antenna plate 7 and the second dielectrics 5.

Substrate holder 8 supporting a substrate 9 is placed in chamber interior 13 to face slot antenna plate 7.

An insulator dielectric 14 is placed between substrate holder 8 and chamber body 2.

A gas supply tube 12 is connected to chamber lid 1 for supplying a reactant gas into chamber interior 13 from the outside. The reactant gas supplied from gas supply tube 12 is directed through gas channels 6a and 6b of support member 6.

Figure 4:
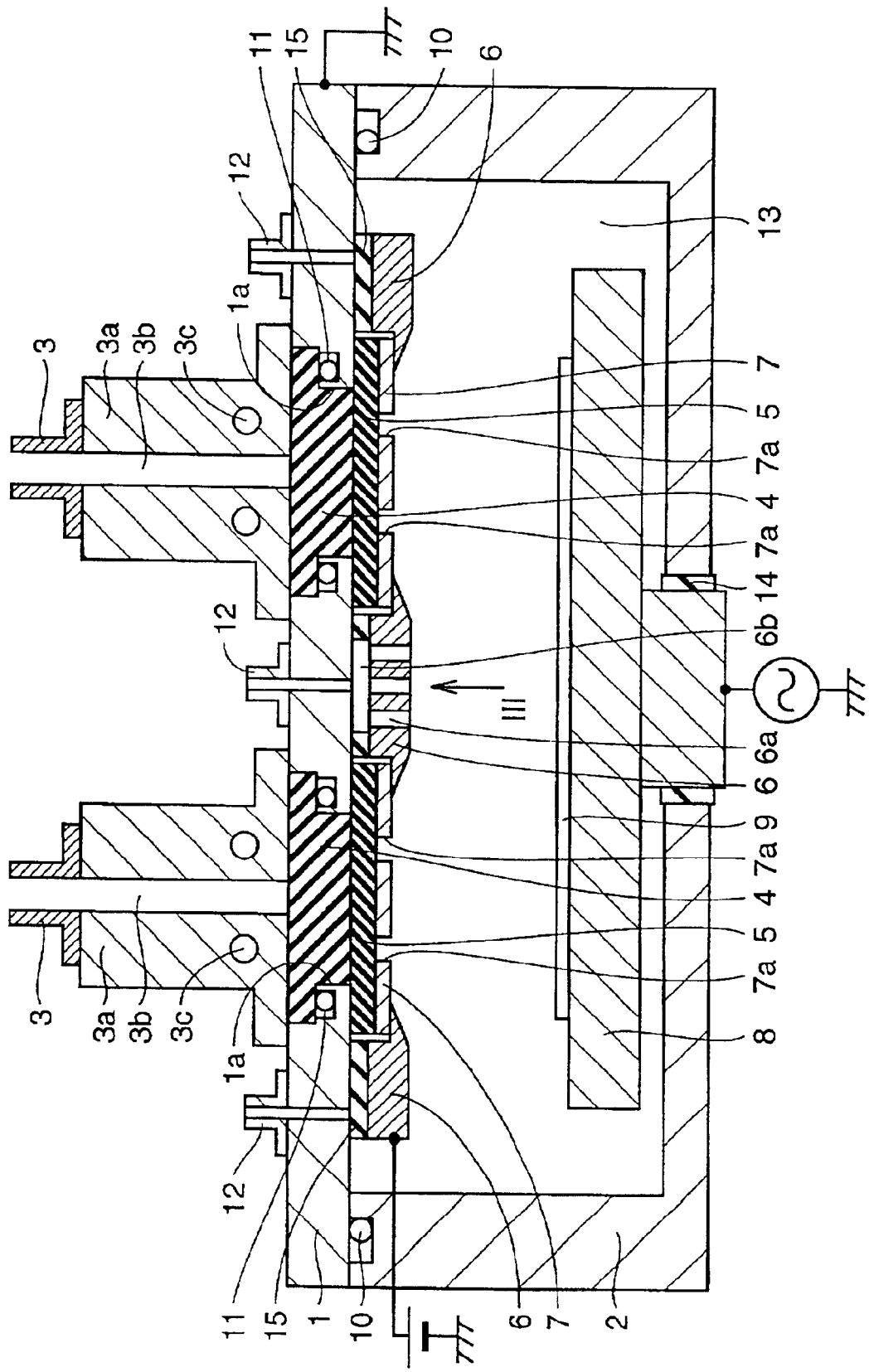
FIG. 4 is a schematic cross section showing a structure for applying a positive potential to the slot antenna plate.

Chamber lid 1 and process chamber body 2 are made of conductor and grounded. Support member 6 and slot antenna plate 7 are also made of conductor and grounded or applied with a positive potential (FIG. 4). For application of substrate bias, a bias voltage of high frequency (frequency: 6 MHz, output: approximately 1 kW) is applied to substrate holder 8. Substrate holder 8 has such mechanisms as electrostatic chuck mechanism for sucking substrate 9 and cooling mechanism for cooling substrate 9 by means of He (helium) gas for example. The bias voltage may be any except for the one described above that has a different frequency, or a DC voltage or pulse voltage. Any suitable bias voltage can be selected to meet a purpose of the process.

If a positive potential is applied to support member 6 and slot antenna plate 7, chamber lid 1 and support member 6 must be insulated by providing an insulator 15 therebetween as shown in FIG. 4 which shows a cross section corresponding to that of FIG. 1.

The position of slots 7a of slot antenna plate 7 is designed as described below.

The position of slots 7a is designed by means of the computer simulation technique. A model shape from a microwave entrance to the second dielectrics 5 with entrance waveguide 3a and the first dielectric 4 therebetween is formed. Then, an electromagnetic analysis is conducted provided that boundary conditions of the boundary of the model correspond to a perfect conductor. Here, the space formed by the air and dielectric between a microwave generator and the slot antenna serves as a resonator and consequently a standing wave of the microwave is generated. The slot 7a is accordingly positioned directly below the antinode of the standing wave of the microwave in the first and second dielectrics 4 and 5.

Figure 5:
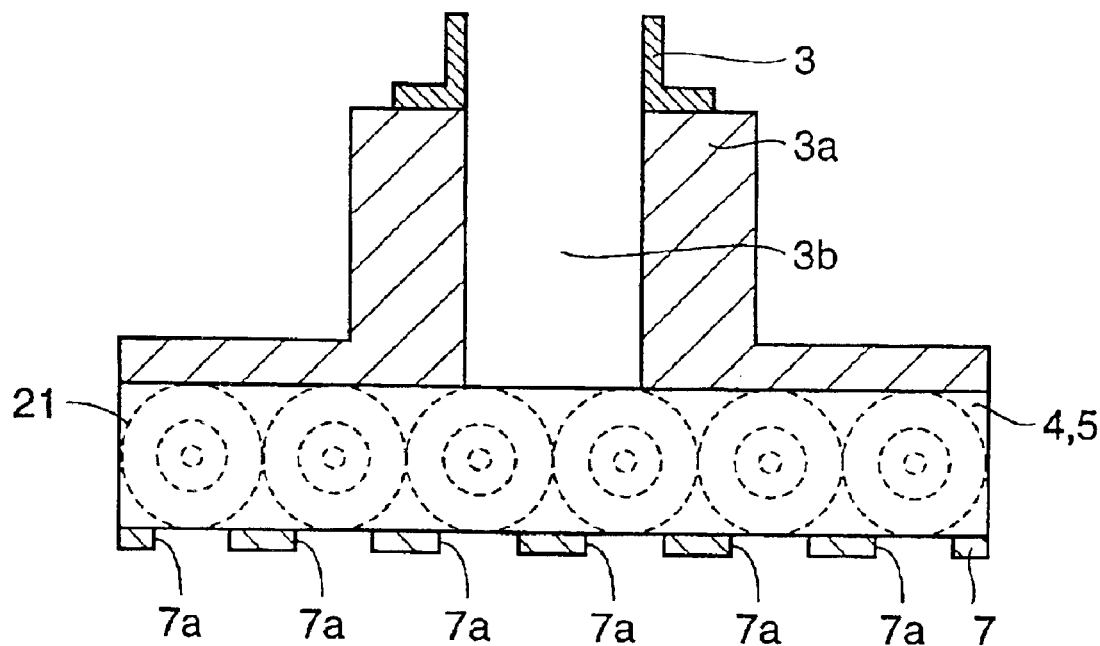
FIG. 5 illustrates a standing wave generated in a dielectric.

The antinode of the standing wave of the microwave refers to a position of the maximum field amplitude of the standing wave. Referring to FIG. 5, the field intensity of the standing wave in the first and second dielectrics 4 and 5 is actually represented by the contour lines drawn as dotted lines 21. The contour lines 21 are nearly circular (or elliptical) in shape, and a circle (or ellipse) closer to the center represents a greater field intensity. Then, slot 7a is positioned directly below the center of nearly circular (or elliptical) contour line 21.

The magnetic field is greater at the position directly below the antinode of the standing wave. Slot 7a is thus provided at that position to induce current around slot 7a. This current causes a magnetic field to be generated from slot 7a. Namely, slot 7a is positioned directly below the antinode of the standing wave to efficiently radiate microwave into chamber interior 13.

Slot 7a is rectangular for example. Then, slot 7a is designed to have the longer side with a half length of the space wavelength in the dielectric (e.g. approximately 20 mm provided that the dielectric has a relative dielectric constant of 10 and the frequency is 2.45 GHz and to have the shorter side which is one-half or less of the longer side in length. Usually, the radiation efficiency of the microwave is enhanced when the longer side of the rectangular slot of the slot antenna is λ/2. Slot 7a can be shaped in this way to enhance the radiation efficiency of the microwave.

Preferably, the shape of slot 7a is varied depending on the size of the standing-wave distribution. Specifically, the longer side of slot 7a is made shorter where the field amplitude is large. Depending on the position of slot 7a, the amount of microwave radiation could vary. Therefore, a slot 7a of a greater radiation amount has its longer side which is shortened for decreasing the radiation amount in order to radiate the same amount of microwave as that from other slots. Accordingly, microwave radiation from slots 7a can be rendered uniform.

The slots 7a are thus designed to allow slot antenna plate 7 to function as a slot antenna for microwave which can efficiently and uniformly be radiated from slots 7a.

It is noted that slots 7a are designed with the number and shape according to the structure of a resonator. In other words, any design may be employed on the condition that the microwave is radiated uniformly from slots 7a. For example, rectangular slots 7a may be different in length and width as described above, or the central axis of slot 7a may be declined with respect to the longitudinal side of the slot antenna plate.

An operation of the plasma processing apparatus according to the first embodiment is described below that is used as a dry etching apparatus for an $SiO_2$ film for example.

Referring to FIG. 1, by vacuum pumping means, a vacuum state is preliminarily created and maintained in chamber interior 13. Then, a process gas such as $CF_4$ and $O_2$ is supplied from gas supply tube 12 at a predetermined flow rate controlled by a mass flow controller (not shown). The process gas thereafter branches into a plurality of gas channels to be supplied to chamber interior 13 through a plurality of gas holes 6a. The pressure of chamber interior 13 is adjusted to a predetermined pressure (eg. 30 Pa) by a pressure regulating mechanism which adjusts the conductance of an exhaust system.

Microwave of a predetermined power (e.g. 2 kW) is supplied and radiated to chamber interior 13 from openings 7a of slot antenna plate 7 through waveguide 3, entrance waveguide 3a and the first and second dielectrics 4 and 5. A bias voltage is applied to substrate 9 as required for taper control of the sidewall of an etched film for example. In this way, plasma is generated uniformly and a film (e.g. $SiO_2$ film) on substrate 8 is etched uniformly.

Other types of insulating films as well as metal films of Al and Ti for example can also be etched by changing the type and mixture ratio of the process gas, setting the gas pressure at a predetermined pressure and providing the microwave of a predetermined power.

According to the first embodiment, a ground potential is applied to chamber lid 1, process chamber body 2, support member 6, and slot antenna plate 7 while a bias voltage is applied to substrate 9. The bias voltage can be adjusted to control the direction, with respect to substrate 9, of plasma ions generated in chamber interior 13.

Regarding the above-described microwave plasma processing apparatus referred to as a conventional apparatus (Japanese Patent Laying-Open No. 2000-91097), most of the dielectric portion faces the plasma discharge plane. In this case, the potential on most of the plane opposite the substrate is a floating potential since the second dielectric is insulator.

According to the first embodiment of the present invention, support member 6 and slot antenna plate 7 are made of conductor so that the potential control is possible by setting the potential of the conductor at a ground potential for example. In this way, the effect of drawing ions and free radicals through application of the bias voltage can fully be achieved. Advantageously, it is possible to enhance the etching rate and expand the control range of the shape produced by etching.

Moreover, according to the first embodiment, slot antenna plate 7 is placed in contact with the second dielectrics 5. The space wavelength is thus shorter than that when an air layer is present between slot antenna plate 7 and the second dielectrics 5. (The wavelength is approximately one-third for the second dielectrics of $Al_2O_3$, AlN.) Shorter intervals between slots 7a are thus possible, which means that a greater number of slots 7a can be formed. Consequently, microwave distribution, namely, plasma distribution can be rendered uniform.

It is noted that respective shapes of entrance waveguide 3a and the first and second dielectrics 6 are not limited to those shown above and may be of any optimum shapes according to the size and shape of the chamber. In this case, the arrangement of slots 7a of slot antenna plate 7 is accordingly designed.

Second Embodiment

Figure 6:
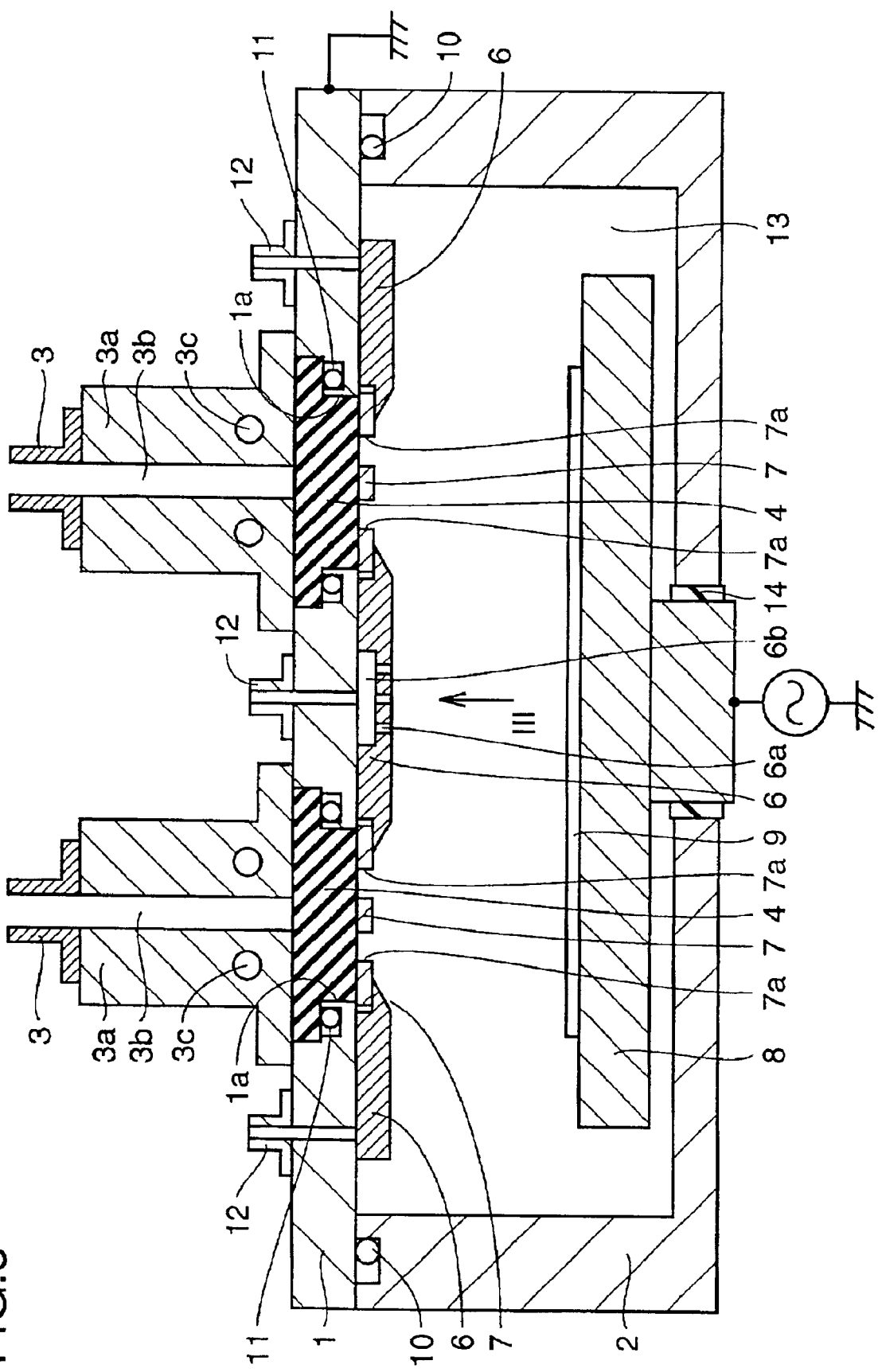
FIG. 6 is a schematic cross section showing a structure of a plasma processing apparatus according to a second embodiment of the present invention.

According to the first embodiment, the microwave is transmitted through the double dielectric structure constituted of the first and second dielectrics. According to a second embodiment, a plasma processing apparatus as shown in FIG. 6 is structured without the second dielectric to extend a first dielectric 4 in the direction of the shorter side (direction in which the waveguide extends). Then, a slot antenna plate 7 contacts the first dielectric 4. A support member 6 supports slot antenna plate 7 only.

Components except for those described above are structured almost similarly to those of the first embodiment. Components corresponding to each other are referred to by the same reference character and description thereof is not repeated.

Slots 7a of slot antenna plate 7 are designed according to the second embodiment as described below.

A model including a microwave entrance, a waveguide 3, an entrance waveguide 3a, and a first dielectric 4 is formed. Then, an electromagnetic analysis is conducted provided that boundary conditions of the boundary of the model correspond to a perfect conductor. This model thus serves as a resonator and consequently a standing wave of the microwave is generated. The slot 7a of slot antenna plate 7 is accordingly designed to be positioned directly below the antinode of the standing wave of the microwave in the second dielectric 5.

Slot 7a is rectangular for example. Then, slot 7a is designed to have the longer side with a half length of the space wavelength in the dielectric (e.g. approximately 20 mm provided that the dielectric has a relative dielectric constant of 10 and the frequency is 2.45 GHz) and to have the shorter side which is one-half or less of the longer side in length. Preferably, each dimension of slot 7a is varied depending on the size of the standing-wave distribution. Specifically, the longer side of slot 7a is made shorter where the field amplitude is large. In this way, slots 7a are designed to allow slot antenna plate 7 to function as a slot antenna for microwave and accordingly serve to efficiently radiate the microwave.

The second embodiment is different from the first embodiment in that the former has no second dielectric. According to the first embodiment, the two-part structure of dielectric formed of the first and second dielectrics is employed that should be designed to have no gap between the first and second dielectrics. In some cases, a gap of approximately several hundreds $\mu$m could be generated depending on the process, assembly and temperature change of the first and second dielectrics, chamber lid 1, support member 6 and the like. Such a gap can be avoided by removal of the second dielectric according to the second embodiment.

Third Embodiment

Figure 7:
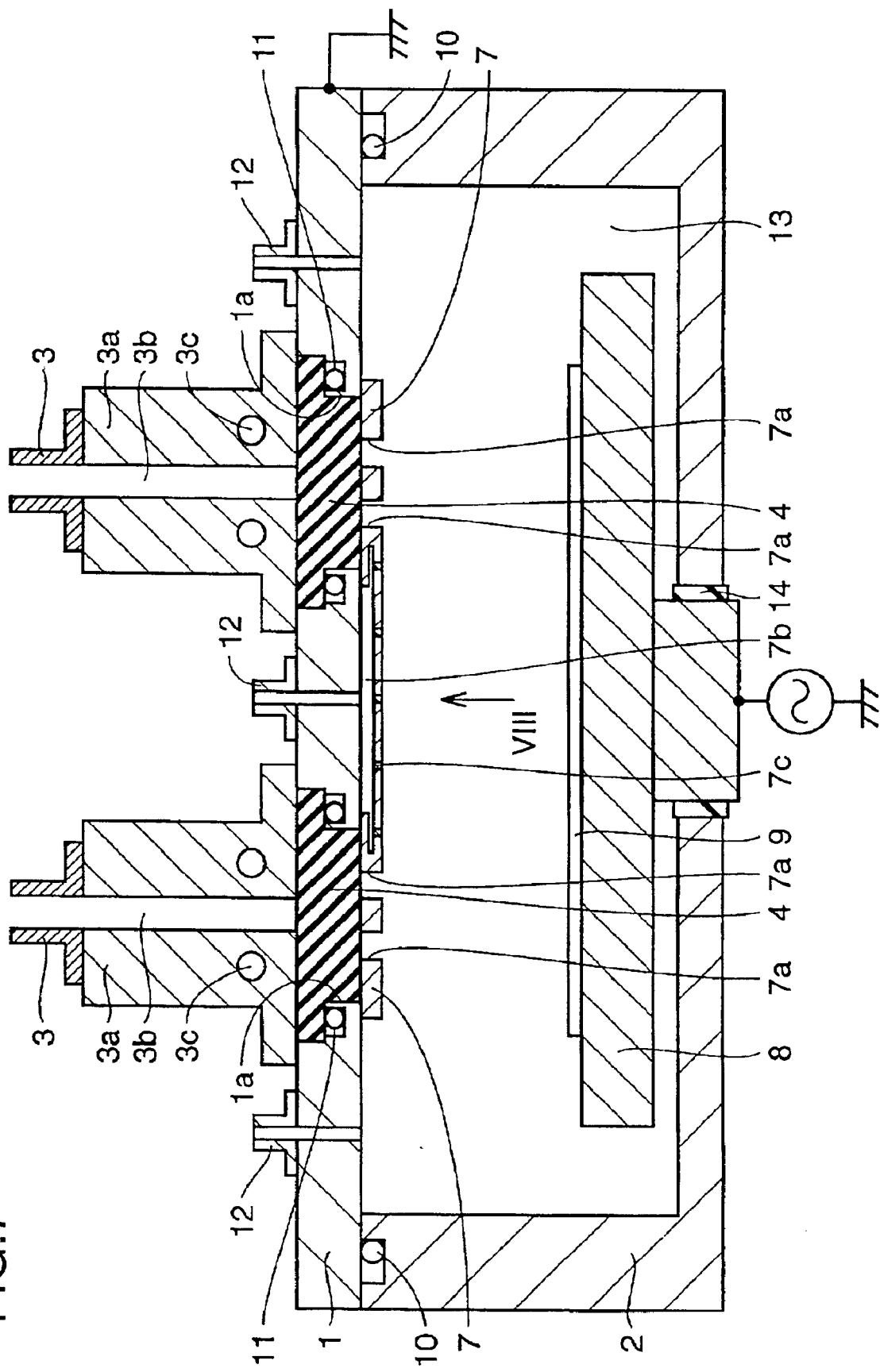
FIG. 7 is a schematic cross section showing a structure of a plasma processing apparatus according to a third embodiment of the present invention.
Figure 8:
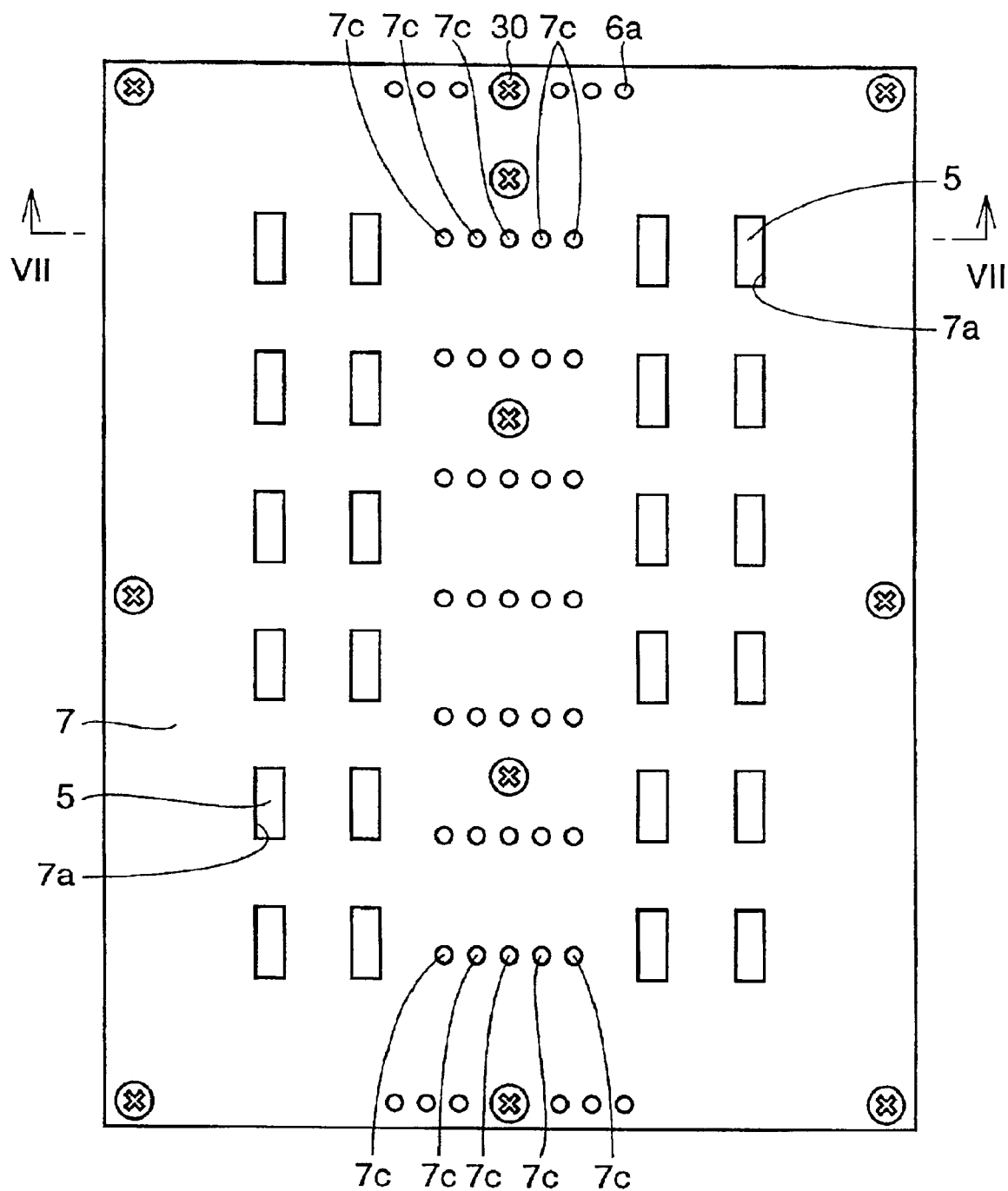
FIG. 8 shows an arrangement of a slot antenna plate and a first dielectric viewed in the direction of arrow VIII in FIG. 7.
Figure 9:
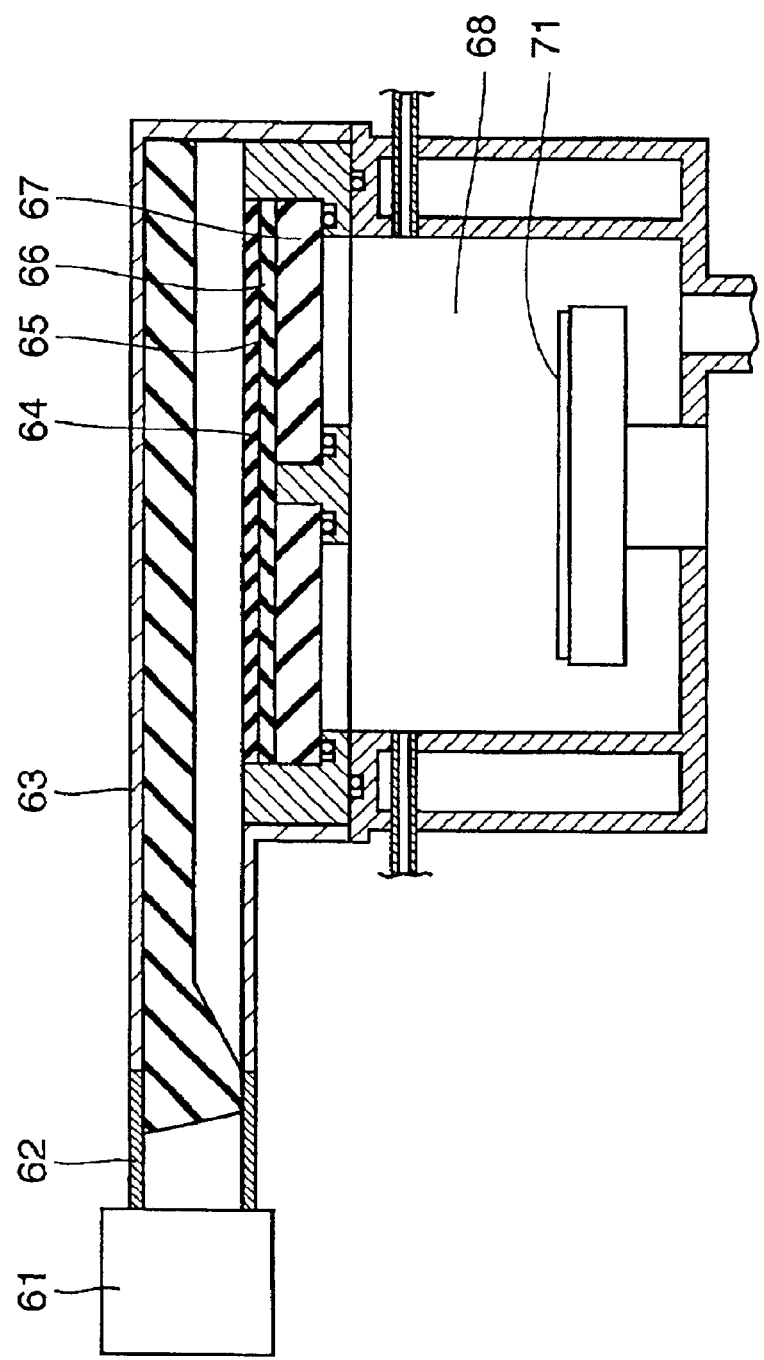
FIG. 9 is a schematic cross section showing a structure of a conventional plasma processing apparatus.

Rerrferring to FIGS. 7 and 8, a plasma processing apparatus according to a third embodiment is structured with gas channels 7b and 7c provided in a slot antenna plate 7. Slot antenna plate 7 is not supported by the support member as employed in the first and second embodiments, but fixed directly to a chamber lid 1 with screws 30 for example.

It is noted that FIG. 7 shows a schematic cross section corresponding to line VII—VII in FIG. 8

Components except for those described above are structured almost similarly to those of the second embodiment. Components corresponding to each other are referred to by the same reference character and description thereof is not repeated.

According to the third embodiment, slot antenna plate 7 has the gas channels. Then, it is not required to provide the gas channels in the support member like those of the first and second embodiments. If the support member has the gas channels, no gas channel can be provided under the first dielectric 4. In this case, optimization of the gas flow in chamber interior 13 is difficult.

Gas channels 7b and 7c provided in slot antenna plate 7 according to the third embodiment can be arranged directly below the first dielectric 4 to optimize the gas flow in chamber interior 13. Moreover, support member 6 of the second embodiment is unnecessary since gas channels 7b and 7c are provided in slot antenna plate 7.

This structure of the third embodiment provides an enhancement of the etching uniformity in a process of etching Al, Ti and TiN films for example where the gas flow has a dominant influence on the etching.

Slot antenna plate 7 and support member 6 may be integrated for the structure of the first embodiment.

When the plasma processing apparatuses described according to the first to third embodiments are used for etching metal such as Al, slot antenna plate 7 itself, if formed of Al, could be etched. In such a case, at least a part of the plane of slot antenna plate 7, the part being exposed to plasma, is desirably coated with $Al_2O_8$. In addition, the inner wall of the chamber is preferably coated with $Al_2O_3$.

The material used for coating as described above is not limited to $Al_2O_3$ and any material is applicable on the condition that the material is unaffected by plasma.

As heretofore discussed, the plasma processing apparatus according to the present invention employs the slot antenna plate made of conductor that is placed on the side of dielectric facing the process chamber in order to facilitate adjustment of the potential of the slot antenna plate. Accordingly, the potential of the slot antenna plate can be adjusted to control the direction of plasma ions for example with respect to a substrate being processed (bias effect). For example, plasma ions can be made incident on the entire surface of the substrate substantially perpendicularly thereto by adjusting the potential of the slot antenna plate at a ground potential and applying a bias voltage to the substrate. A material can thus be plasma-processed uniformly within its plane.

Moreover, the slot antenna plate can be made contact with the dielectric to shorten a space wavelength of microwave compared with that when an air layer is present between the slot antenna plate and dielectric. Consequently, the intervals between openings of the slot antenna plate can be shortened so that a greater number of openings are formed. The microwave radiated into the process chamber through the openings can thus be distributed uniformly in the process chamber.

In addition, a plurality of openings with their positions and dimensions appropriately defined for the standing wave of microwave can provide efficient and uniform radiation of the microwave into the process chamber.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus comprising:

a process chamber for processing by means of plasma;

microwave transmission means for transmitting microwave to said process chamber;

a dielectric for radiating the microwave transmitted by said microwave transmission means into said process chamber; and a slot antenna plate formed of conductor, placed on a side, facing said process chamber, of said dielectric, and including an opening for passing the microwave therethrough radiated from said dielectric wherein said opening of said slot antenna has a longer side with its length equal to half the space wavelength of the microwave wherein the microwave propagates perpendicularly to the surface of the dielectric and wherein the slot antenna plate does not support the dielectric.

2. The plasma processing apparatus according to claim 1, wherein said opening of said slot antenna plate is positioned directly below an antinode of a standing wave of the microwave in a resonator constituted of said microwave transmission means and said dielectric.

3. The plasma processing apparatus according to claim 1, wherein said slot antenna plate has its potential adjusted at a ground potential or a positive potential.

4. The plasma processing apparatus according to claim 1, wherein said slot antenna plate includes a channel for processing gas.

5. The plasma processing apparatus according to claim 1, wherein the length of the longer side of the opening is varied depending on the size of the standing-wave distribution.

* * * * *